United States Patent [19]

Kucharewski

[11] 4,365,174

[45] Dec. 21, 1982

[54] PULSE COUNTER TYPE CIRCUIT FOR POWER-UP INDICATION

[75] Inventor: Nicholas Kucharewski, Lebanon, N.J.

[73] Assignee: RCA Corporation, New York, N.Y.

[21] Appl. No.: 174,184

[22] Filed: Jul. 31, 1980

[51] Int. Cl.³ .................. H03K 17/22; H03K 17/284; H03K 17/30; H03K 5/153

[52] U.S. Cl. .............................. 307/594; 307/220 C; 307/353; 307/593; 307/595; 307/548

[58] Field of Search ........... 307/200 A, 200 B, 220 C, 307/225 C, 268, 451, 475, 279, 352, 353, 577, 579, 583, 585, 592, 594, 595-597, 548; 328/48

[56] References Cited

U.S. PATENT DOCUMENTS

| | | | |
|---|---|---|---|
| 3,906,254 | 9/1975 | Lane et al. | 307/475 |
| 3,922,566 | 11/1975 | Kodama et al. | 307/225 C X |
| 4,045,688 | 8/1977 | Stewart | 307/220 C X |
| 4,124,807 | 11/1978 | Herber | 307/225 C X |
| 4,140,930 | 2/1979 | Tanaka | 307/594 X |
| 4,144,526 | 3/1979 | Wotruba | 340/347 AD |
| 4,180,807 | 12/1979 | Eichelberger et al. | 340/347 AD |
| 4,210,829 | 7/1980 | Wong et al. | 307/296 R |

OTHER PUBLICATIONS

Electronics, Feb. 15, 1979, "Touch-Tone Decoder Chip Mates Analog Filters with Digital Logic", by Jacobs, Landsburg, White and Hodges, pp. 105-112.

*Primary Examiner*—Larry N. Anagnos
*Attorney, Agent, or Firm*—E. M. Whitacre; P. J. Rasmussen; P. M. Emanuel

[57] ABSTRACT

A circuit for counting pulses which may be used, for example, to provide a power on reset signal after power is applied to a circuit, employing charge transfer between two capacitors. The counter charges a first capacitor to a first voltage level between input pulses. During each input pulse, a portion of the charge stored on the first capacitor is transferred to the second capacitor. The voltage across the second capacitor increases with each input pulse. When the voltage on the second capacitor reaches a predetermined threshold level, an output signal is provided by a threshold detector to indicate that a predetermined number of input pulses has been counted. The second capacitor is then discharged in order to reset the pulse counter before beginning another counting cycle.

6 Claims, 2 Drawing Figures

PULSE COUNTER TYPE CIRCUIT FOR POWER-UP INDICATION

FIELD OF THE INVENTION

This invention relates to circuits for counting pulses.

BACKGROUND OF THE INVENTION

A pulse counter serves many useful purposes. For example, in electronic systems, the need often arises to provide a reset signal when power is initially applied to the system. The reset signal is applied for a predetermined time interval of sufficient duration to assure stable operation of the system, and thereafter removed. For electronic systems containing a source of pulses, a power on reset apparatus may include a pulse counter which begins in a known state after power is applied, and provides an output signal corresponding to a power up reset signal until a predetermined count is reached.

A pulse counter may also be used as a frequency divider. The latter is accomplished by applying an output signal of the counter to reset the counter after counting a predetermined number of input pulses, equal to the division factor of the frequency divider.

In the prior art, a simple pulse counter may be realized using a diode, a resistor, and a capacitor in series. Each successive input pulse adds charge to the capacitor through the series diode until the voltage across the capacitor exceeds a predetermined threshold level. However, such prior art counter often requires a large value resistor and capacitor, both of which are difficult to accurately realize in integrated circuit form. Moreover, such prior art counter is frequency and amplitude dependent in that the input pulses must be substantially at a known predetermined frequency and at a known predetermined amplitude in order that the output indication represent a predetermined pulse count.

SUMMARY OF THE INVENTION

The present invention is embodied in a pulse counter for providing an output indication after counting a predetermined number of input pulses. The counter comprises first and second capacitors and first and second switches. The first capacitor is charged to a first voltage level through the first switch between input pulses. During each input pulse, a portion of the charge stored in the first capacitor is transferred to the second capacitor through the second switch. The voltage across the second capacitor increases with each successive input pulse. A count of a predetermined number of input pulses is thereby indicated when the voltage across the second capacitor exceeds a predetermined threshold level.

DETAILED DESCRIPTION

Figure 1:
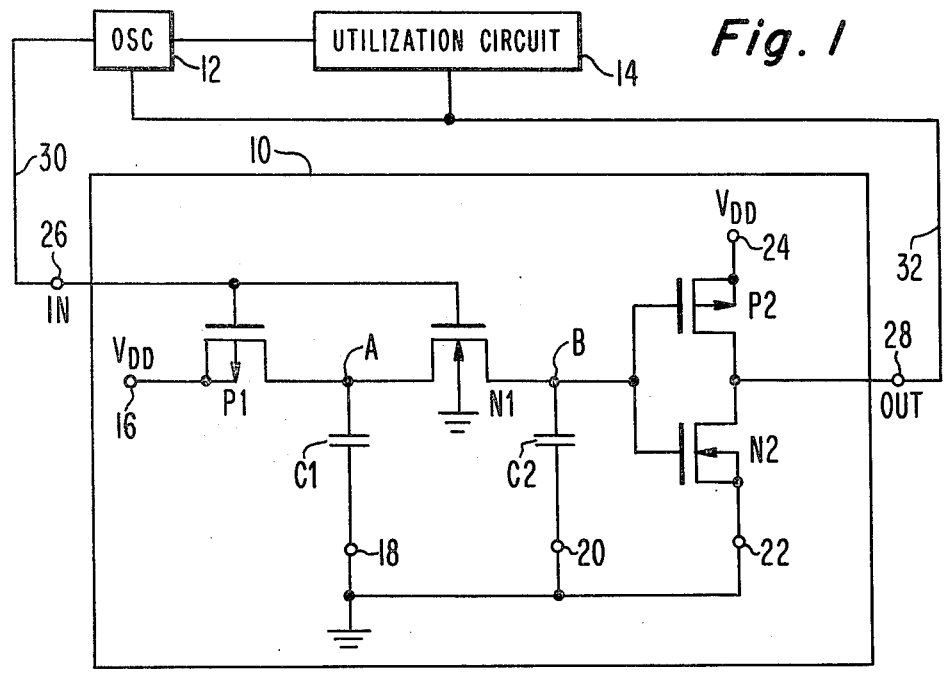
FIG. 1 is a schematic diagram illustrating an embodiment of a pulse counter circuit constructed in accordance with the present invention employed in an initialization circuit.

FIG. 1 shows a pulse counter circuit 10 used to generate a power on reset signal for utilization by circuit 14 and oscillator 12. The counter circuit 10 comprises two capacitors C1 and C2, two P channel MOS transistors, P1 and P2, and two N channel MOS transistors N1 and N2. Transistor P1 is connected as a transmission gate switch to conduct current between terminal 16 and circuit node A. An operating potential, $V_{DD}$, is provided at terminal 16. Transistor N1 is connected as a transmission gate switch to conduct current between circuit node A and circuit node B. The gate electrodes of transistors P1 and N1 are both connected to input terminal 26. Capacitor C1 is connected between node A and terminal 18. Capacitor C2 is connected between node B and terminal 20. Terminals 18 and 20 are returned to a convenient reference potential, e.g., such as ground potential.

Transistors P2 and N2 are connected as a complementary symmetry inverting amplifier having an input electrode at the interconnection of their gate electrodes at node B, and an output electrode at the interconnection of their drain electrodes at terminal 28. The source electrode of transistor P2 at terminal 24 is connected to a source of operating potential, in this case, $V_{DD}$, and the source electrode of transistor N2 at terminal 22 is connected to a source of reference potential, in this case, ground potential.

In operation, assume that capacitors C1 and C2 are initially discharged before power is applied. Power is simultaneously applied to circuit 14, oscillator 12, and terminals 24 and 16 of the counter 10. As $V_{DD}$ exceeds the threshold voltage of transistor P2, that transistor becomes conductive providing a voltage substantially equal to $V_{DD}$ on output terminal 28. An output potential equal to $V_{DD}$ on terminal 28 corresponds to to a logic 1 for the power up reset signal which indicates to circuit 14 and oscillator 12 that power has been turned on.

Assuming that the potential on conductor 30 is at ground potential when power is applied, then transistor P1 is conductive, charging capacitor C1 up to $V_{DD}$ potential. Transistor N1, however, is nonconductive so that capacitor C2 remains discharged. Before any pulses are provided by oscillator 12, node A is at $V_{DD}$ (logic 1 level) and node B is at 0 (logic 0 level) volts. Terminal 28 remains at $V_{DD}$ potential. In response to the application of power, oscillator 12 provides output pulses on conductor 30.

When the pulse signal on conductor 30 goes to a logic 1 level, transistor P1 is nonconductive and N1 is conductive. This action connects capacitor C1 and C2 in parallel. Since capacitor C1 is at a higher potential than capacitor C2, a portion of the charge previously stored on capacitor C1 is transferred to capacitor C2 through transistor N1. As a specific example, assume that the value of capacitor C2 is 9 times that of C1. The charge stored in capacitor C1 is $V_{DD} \times C1$. The charge stored on capacitor C2 is zero. The capacitance of the resulting parallel combination of C1 and C2 is C1+C2. Since total charge is conserved, the resulting voltage across the parallel combination of C1 and C2 is $V_{DD} \times C1/(C1+C2)$, or $0.1 V_{DD}$.

When the pulse signal on conductor 30 goes to a logic 0 level, transistor P1 comes conductive charging capacitor C1 up to $V_{DD}$ again. Transistor N1 is rendered essentially nonconductive so that C2 retains its charge. Thus, after one input pulse, node B is at $0.1 V_{DD}$ and node A is at $V_{DD}$.

When the pulse signal on conductor 30 changes to a logic 1 level again, a portion of the charge stored on capacitor C1 is transferred to capacitor C2. The charge stored on capacitor C1 is $V_{DD} \times C1$. The charge stored on capacitor C2, as a result of the previous input pulse, is 0.1 $V_{DD} \times C2$. Since total charge is conserved, the resulting voltage across the parallel combination of C1 and C2 is $V_{DD} \times C1/(C1+C2)$ plus 0.1 $V_{DD} \times C2/(C1+C2)$, or 0.1 $V_{DD}$ plus 0.09 $V_{DD}$, equal to 0.19 $V_{DD}$. When the pulse signal on conductor 30 goes low again, capacitor C1 charges to potential $V_{DD}$ while node B remains essentially at 0.19 $V_{DD}$. Thus, after two input pulses, node A is at $V_{DD}$ and node B is at 0.19 $V_{DD}$.

Similarly, for the third and fourth successive input pulses the potential at node B successively increments to 0.27 $V_{DD}$, and then 0.34 $V_{DD}$ respectively.

The inverter P2, N2 functions as a threshold detector providing an output indication at terminal 28 when the potential at node B exceeds a predetermined threshold equal to the switching point of the inverter P2, N2. When the potential at node B increases above the switching point of the inverter P2, N2, the output thereof switches from a logic 1 to a logic 0.

The switching point of the inverter P2, N2 is determined by the relative conductivity of transistors P2 and N2. Assuming that the transfer characteristics of P2 and N2 are matched, then the switching point is approximately 0.5 $V_{DD}$. If the conductivity of transistor P2 is greater than that of transistor N2, then the switching point of the inverter is shifted towards $V_{DD}$; if the conductivity of transistor P2 is less than that of transistor N2, then the switching point of the inverter is shifted towards ground potential. The relative conductivity of transistors P2 and N2 can be set by adjusting the relative size of each transistor.

Continuing the above example, the voltage at node B after the sixth input pulse is 0.41 $V_{DD}$. The output of inverter P2, N2 at terminal 28 remains at a logic 1 level. However, after the seventh input pulse, the input of the inverter at node B is 0.52 $V_{DD}$. Since 0.52 $V_{DD}$ exceeds the switching point of the inverter P2,N2, the output therefrom provides a logic 0 output on terminal 28, which indicates the removal of the power up reset signal from circuit 14 and oscillator 12.

The power up reset signal on terminal 28 may be used by the circuit 14 and oscillator 12 for various purposes such as for initializing internal counters or inhibiting output signals during power up. The reset signal may also be used by oscillator 12 for providing a higher power supply voltage when starting up oscillator 12 and a lower power supply voltage after oscillator 12 has established stable operation, thereby facilitating reliable oscillator start up while conserving steady state circuit power consumption.

The predetermined number of input pulses at which counter circuit 10 provides an output indication is set by adjusting the ratio of capacitors C1 and C2, and by adjusting the switching point of the inverter P2,N2. The higher the ratio of C2 to C1, the higher the predetermined count. The higher the switching point of the inverter, P2,N2, the higher the predetermined count. Note that the predetermined count of counter 10 is independent of the absolute value of capacitance or supply voltage, but is instead determined by the respective ratio of capacitors or ratio of transistor conductivity.

Counter 10 may also be used as a frequency divider by applying the output signal of the counter to reset the counter. Counter 10 may be reset by discharging capacitor C2. The latter may be accomplished by using a switch, such as a transistor controlled by the output signal at terminal 28, and connected to conduct current between node B and ground. Capacitor C2 is then discharged after the counter 10 counts a predetermined number of input pulses at input terminal 26. The frequency of the pulse signal output at terminal 28 is then equal to the frequency of the signal at input terminal 26 divided by the predetermined count of counter 10.

Figure 2:
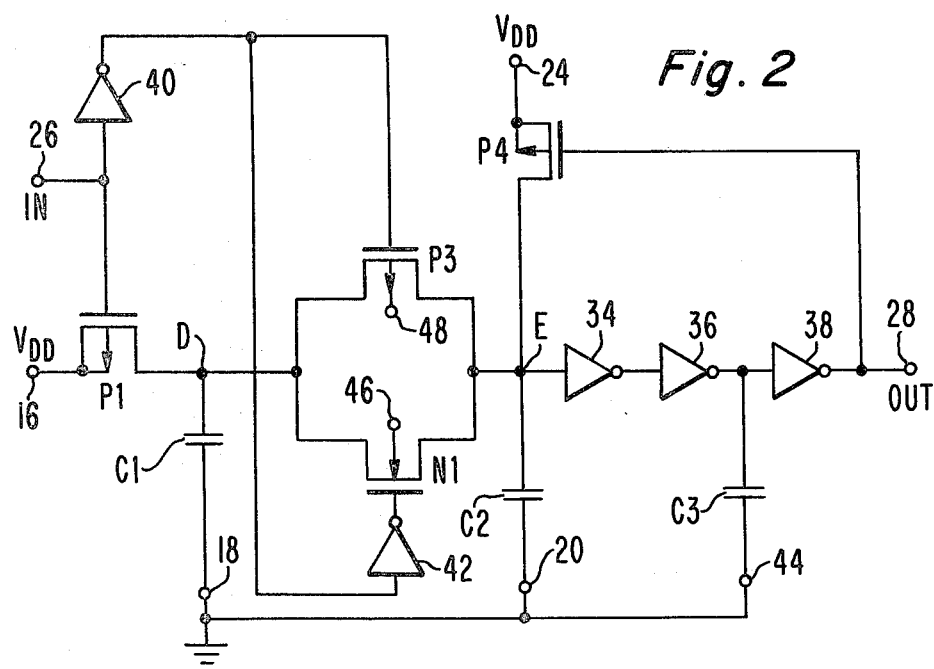
FIG. 2 is a schematic diagram illustrating an alternate embodiment of a pulse counter circuit constructed in accordance with the present invention.

FIG. 2 shows a counter circuit constructed in accordance with the present invention further comprising an output latch circuit for charging capacitor C2 to supply potential $V_{DD}$ when the potential across C2 exceeds a predetermined threshold. The output latch circuit therefore improves the noise immunity of the counter when used as an initialization circuit, by rapidly charging capacitor C2 well above the predetermined threshold just after such predetermined threshold is reached.

The output latch comprises inverters 34, 36 and 38, capacitor C3, and P-channel transistor P4. Inverters 34, 36 and 38 are connected in series. The output of inverter 38 is coupled to the input of inverter 34 through the gate and drain electrodes of transistor P4. The source electrode of transistor P4 is connected to the operating potential $V_{DD}$ at terminal 24. Capacitor C3 is connected between the input of inverter 38 and terminal 44, which is connected to ground potential.

The counter of FIG. 2 further includes transistors P3 and N1 connected as a complementary symmetry transmission gate to conduct current between circuit node D and circuit node E. A complementary symmetry switch has a lower impedance when conductive as compared to a single transistor switch and permits node E to be charged to a potential equal to that of node D over the full power supply range between 0 and $V_{DD}$. The gate electrodes of transistors P3 and N1 are connected to respective output terminals of inverters 40 and 42. The substrate electrode of transistor P3 at terminal 48 is connected to $V_{DD}$ potential. The substrate electrode of transistor N1 at terminal 46 is connected to ground potential. Transistors P3 and N1 are conductive when the input signal at terminal 26 is at logic 1 and are nonconductive when the input signal at terminal 26 is at logic 0.

Capacitors C3 and C2 insure that the output latch will power up in a known state. Initially, C3 is discharged which corresponds to a logic 0 at the input of inverter 38. Thus, the output of inverter 38 conditions transistor P4 to be nonconductive, so that capacitor C2 remains uncharged when power is applied.

In operation, input pulses are applied at input terminal 26. Between input pulses, when the input terminal 26 is at logic 0, capacitor C1 is charged to $V_{DD}$ through transistor P1. During each input pulse, when the input terminal 26 is at logic 1, a portion of the charge stored on capacitor C1 is transferred to capacitor C2 through transistors P3 and N1. For each successive input pulse, the potential at node E increases. When the potential at node E exceeds the switching point of inverter 34, the output of inverter 34 changes to a logic 0 level causing the output of inverter 36 to charge capacitor C3 to a logic 1 level. When capacitor C3 charges to a logic 1 level, the output of inverter 38 changes to logic 0 level which conditions transistor P4 to conduct current. Capacitor C2 at node B is therefore charged to $V_{DD}$ through transistor P4. Thus, when node E exceeds the switching point of inverter 34, the latch circuit 34, 36, 38, P4 operates to charge and hold node E at $V_{DD}$ potential.

What is claimed is:

1. A pulse counter type power-up circuit providing an output indication delayed from the application of an operating potential to a power supply terminal comprising;
  input and output terminals;
  coupling means for continuously coupling said input terminal to said power supply terminal;
  a source of clock pulses;
  a first capacitor having a first capacitance value and a second capacitor having a second capacitance value substantially greater than said first capacitance value;
  first switch means having first and second terminals defining the ends of a conduction path and a control terminal for controlling the conduction of said conduction path, said first terminal being coupled to said input terminal, said second terminal being coupled to said first capacitor, and said control terminal being coupled to said source of clock pulses and being responsive to a first level of said clock pulses for charging said first capacitor to a predetermined voltage level;
  second switch means having first and second terminals defining the ends of a conduction path and a control terminal for controlling the conduction of said conduction path, said first terminal being coupled to said first capacitor, said second terminal being coupled to said second capacitor, and said control terminal being coupled to said source of clock pulses and being responsive to a second level of said clock pulses for transferring only a portion of the charge stored on said first capacitor to said second capacitor to thereby increase the voltage level developed across said capacitor by an incremental amount substantially less than said predetermined voltage level in response to each clock pulse; and
  threshold detector means having an input coupled to said second capacitor and an output coupled to said output terminal and being responsive to the voltage developed across said second capacitor for providing an output indication at said output terminal when the voltage developed across said second capacitor increases above a predetermined threshold level.

2. A pulse counter type power-up circuit according to claim 1, further including a second power supply terminal, said second power supply terminal receiving a reference and wherein;
  each of said first and second capacitors has respective pairs of first and second terminals; and
  said second power supply terminal is connected to the first terminals of said first and second capacitors, said second terminal of said first switch means is connected to said first terminal of said second switch means and to said second terminal of said first capacitor, and said second terminal of said second switch means is connected to said second terminal of said second capacitor.

3. A pulse counter type power-up circuit according to claim 2 wherein said first switch means comprises a field-effect transistor of a first conductivity type and said second switch means comprises a field-effect transistor of the opposite conductivity type.

4. A pulse counter type power-up circuit according to claim 3 wherein said threshold detector means comprises:
  third and fourth field-effect transistors, each having respective source, gate and drain electrodes, said fourth field-effect transistor being of the opposite conductivity type as said third field-effect transistor;
  means for connecting said third and fourth field-effect transistors as an inverting amplifier, that means comprising:
  a connection from said first power supply terminal to the source electrode of said third transistor, a connection from said second power supply terminal to the source electrode of said fourth transistor, a connection from the second terminal of said second capacitor to the gate electrodes of said third and fourth transistors, and a connection from the drain electrodes of said third and fourth transistors to said output terminal.

5. A pulse counter type power-up circuit according to claim 2, further including:
  first, second and third inverters, each having respective input and output terminals;
  means for connecting said first, second and third inverters in series, the input terminal of said first inverter being connected to said second terminal of said second capacitor, the output terminal of said first inverter being connected to the input terminal of said second inverter, the output terminal of said second inverter being connected to the input terminal of said third inverter, the output terminal of said third inverter being connected to said output terminal;
  a third capacitor coupled between the input terminal of said third inverter and said second power supply terminal for preventing said output indication before the voltage across said second capacitor increases above said predetermined threshold; and
  third switch means having first and second terminals defining the ends of a conduction path and a control terminal for controlling the conduction of said conduction path, said first terminal being connected to said first power supply terminal, said second terminal being connected to said second terminal of said second capacitor, and said control terminal being connected to said output terminal whereby said second capacitor is charged to the potential at said first power supply terminal when the voltage across said second capacitor exceeds said predetermined threshold level.

6. A pulse counter type power-up circuit according to claim 1, further including:
  output latch means responsive to said output indication of said threshold detector means for charging said second capacitor to a voltage substantially greater than said predetermined threshold; and
  means for preventing said output latch means from charging said second capacitor to said substantially greater voltage absent said output indication.

* * * * *